United States Patent
Mihajlovic et al.

(10) Patent No.: US 9,429,633 B2
(45) Date of Patent: Aug. 30, 2016

(54) MAGNETIC SENSOR UTILIZING RASHBA EFFECT IN A TWO-DIMENSIONAL CONDUCTOR

(71) Applicant: HGST Netherlands B.V., Amsterdam (NL)

(72) Inventors: Goran Mihajlovic, San Jose, CA (US); Petrus A. Van Der Heijden, Cupertino, CA (US)

(73) Assignee: HGST Netherlands B.V., Amsterdam (NL)

( * ) Notice: Subject to any disclaimer, the term of this patent is extended or adjusted under 35 U.S.C. 154(b) by 414 days.

(21) Appl. No.: 13/764,619

(22) Filed: Feb. 11, 2013

(65) Prior Publication Data

US 2014/0225604 A1   Aug. 14, 2014

(51) Int. Cl.
*G01R 33/09* (2006.01)
*G11B 5/39* (2006.01)
*B82Y 10/00* (2011.01)

(52) U.S. Cl.
CPC ............ *G01R 33/093* (2013.01); *B82Y 10/00* (2013.01); *G11B 5/3909* (2013.01); *G11B 5/3912* (2013.01); *G11B 2005/3996* (2013.01)

(58) Field of Classification Search
CPC ................. B82Y 25/00; B82Y 10/00; G11B 2005/3996; G11B 5/3932; G01R 33/093; G01R 33/09
USPC ............ 324/252; 360/324.12, 324.11, 324.2; 428/81; G9B/5.124, 5.114
See application file for complete search history.

(56) References Cited

U.S. PATENT DOCUMENTS

| | | | |
|---|---|---|---|
| 6,636,396 B1 * | 10/2003 | Gill | 360/324.12 |
| 7,270,854 B2 * | 9/2007 | Freitag et al. | 427/523 |
| 7,468,557 B2 * | 12/2008 | Schroder | 257/757 |
| 7,551,409 B2 * | 6/2009 | Carey et al. | 360/324.12 |
| 7,599,154 B2 * | 10/2009 | Sbiaa et al. | 360/324.11 |
| 7,719,070 B2 | 5/2010 | Hall et al. | |
| 7,820,998 B2 | 10/2010 | Finkelstein et al. | |
| 7,956,395 B2 | 6/2011 | Inokuchi et al. | |
| 7,960,757 B2 | 6/2011 | B A Jalil et al. | |
| 7,994,555 B2 | 8/2011 | Koo et al. | |

(Continued)

OTHER PUBLICATIONS

Parkin et al., "Magnetically Engineer Spintronic Sensors and Memory," 2003 IEEE, Proceedings of the IEEE, vol. 91, No. 5, May 2003, pp. 661-680.

(Continued)

*Primary Examiner* — Melissa Koval
*Assistant Examiner* — Rahul Maini
(74) *Attorney, Agent, or Firm* — Zilka-Kotab, PC (57) ABSTRACT

A magnetic sensor that utilizes Rashba effect to generate spin polarization. The sensor eliminates the need for a pinned layer structure and therefore, greatly reduces the gap thickness of the sensor allowing for greatly improved data density. The sensor includes a two dimensional conductor adjacent to a magnetic free layer, that can also be separated from the free layer by a non-magnetic, electrically insulating barrier layer and that can also be constructed with or without side shields. A current flow through the two-dimensional conductor in a direction parallel with the air bearing surface causes a spin polarization oriented perpendicular to the air bearing surface. The voltage output of the sensor changes with changing magnetization direction of the free layer relative to spin polarization in the two dimensional conductor.

15 Claims, 8 Drawing Sheets

(56) References Cited

U.S. PATENT DOCUMENTS

| | | | |
|---|---|---|---|
| 8,004,800 B2* | 8/2011 | Freitag | 360/324.12 |
| 8,187,967 B2* | 5/2012 | Lee et al. | 438/618 |
| 8,576,519 B1* | 11/2013 | Carey et al. | 360/324 |
| 2004/0120082 A1* | 6/2004 | Ikegami et al. | 360/324.11 |
| 2010/0123133 A1 | 5/2010 | Wunderlich et al. | |
| 2011/0037512 A1 | 2/2011 | Finkelstein et al. | |
| 2011/0045318 A1 | 2/2011 | Lee et al. | |
| 2012/0018822 A1 | 1/2012 | Gaudin et al. | |
| 2012/0020152 A1 | 1/2012 | Gaudin et al. | |
| 2012/0098077 A1 | 4/2012 | Gaudin et al. | |
| 2013/0108889 A1* | 5/2013 | Piramanayagam | G11B 5/3909 428/811.2 |

OTHER PUBLICATIONS

Nitta et al., "Electrical Manipulation of Spin Precession in an InGaAs-Based 2DEG Due to the Rashba Spin-Orbit Interaction," 2007 IEEE, IEEE Transactions on Electron Devices, vol. 54, No. 5, May 2007, pp. 955-960.

Inoue et al., "Diffuse transport and spin accumulation in a Rashba two-dimentional electron gas," The American Physical Society, Jan. 31, 2003, vol. 67, pp. 1-6.

Ast et al, "Giant Spin Splitting through Surface Alloying," Phys. Rev. Lett., vol. 98, Issue 18, 186807, May 4, 2007, 4 pages.

Edelstein, V. M., "Spin Polarization of Conduction Electrons Induced by Electric Current in Two-Dimensional Asymmetric Electron Systems," Solid State Comm., vol. 73, Issue 3, 1990, pp. 233-235.

Fukuma et al., "Giant enhancement of spin accumulation and long-distance spin precession in metallic lateral spin valves," Nature Materials, vol. 10, Jul. 2011 (Published online Jun. 12, 2011), pp. 527-531.

Ishizaka et al., "Giant Rashba-type spin splitting in bulk BiTeI," Nature Materials, vol. 10, Jul. 2011 (Published online Jun. 19, 2011), pp. 521-526.

LaShell et al., "Spin Splitting of an Au(111) Surfac State Band Observed with Angle Resolved Photoelectron Spectroscopy," Phys. Rev. Lett., vol. 17, Issue 16, Oct. 14, 1996, 3419-3422.

Rybkin et al., "Large spin-orbit splitting in light quantum films: Al/W (110)," Phys. Rev. B, vol. 82, Issue 23, 2010, pp. 233403-1-233403-4.

Silsbee, R. H., "Spin-orbit induced coupling of charge current and spin polarization," J. Phys.: Condens. Matter, vol. 16, Issue 7, 2004, pp. R179-R207.

Yaji et al., "Large Rashba spin splitting of a metallic surface-state band on a semiconductor surface," Nature Communications, vol. 1, Issue 17, May 17, 2010, pp. 1-5.

* cited by examiner

MAGNETIC SENSOR UTILIZING RASHBA EFFECT IN A TWO-DIMENSIONAL CONDUCTOR

FIELD OF THE INVENTION

The present invention relates to magnetic data recording and more particularly to a magnetic sensor that utilizes Rashba spin orbit interaction in a two dimensional conductor for polarization of electron spins.

BACKGROUND OF THE INVENTION

At the heart of a computer is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider into contact with the surface of the disk when the disk is not rotating, but when the disk rotates air is swirled by the rotating disk. When the slider rides on the air bearing, the write and read heads are employed for writing magnetic impressions to and reading magnetic impressions from the rotating disk. The read and write heads are connected to processing circuitry that operates according to a computer program to implement the writing and reading functions.

The write head includes at least one coil, a write pole and one or more return poles. When a current flows through the coil, a resulting magnetic field causes a magnetic flux to flow through the write pole, which results in a magnetic write field emitting from the tip of the write pole. This magnetic field is sufficiently strong that it locally magnetizes a portion of the adjacent magnetic disk, thereby recording a bit of data. The write field, then, travels through a magnetically soft under-layer of the magnetic medium to return to the return pole of the write head.

A magnetoresistive sensor such as a Giant Magnetoresistance (GMR) sensor or a Tunnelling Magnetoresistance (TMR) sensor can be employed to read a magnetic signal from the magnetic media. The magnetoresistive sensor has an electrical resistance that changes in response to an external magnetic field. This change in electrical resistance can be detected by processing circuitry in order to read magnetic data from the adjacent magnetic media.

As the need for data density increases there is an ever present need to decrease the bit length in order to increase the linear data density. With regard to the magnetic head, this means reducing the shield-to-shield (SS) spacing of the read head (i.e. the read gap thickness). However, physical limitations as well as manufacturing limitations have constrained the amount by which the gap thickness of the magnetic read head can be reduced. For example current magnetic sensors require a pinned layer structure that includes two anti-parallel coupled magnetic layers with a non-magnetic layer sandwiched between them and a relatively thick antiferromagnetic (AFM) material layer to pin one of the magnetic layers. This pinned layer structure consumes a large amount of the gap budget and greatly impedes efforts to reduce the gap thickness (and consequently the bit length) of the recording system. Therefore, there remains a need for magnetic sensor design that can provide the reduced gap thickness needed for future magnetic recording requirements.

SUMMARY OF THE INVENTION

The present invention provides a magnetic sensor that includes a two-dimensional conductor formed on an electrically conductive substrate, and a magnetic free layer formed adjacent to the two-dimensional conductor.

The sensor may also include a non-magnetic, electrically insulating barrier layer sandwiched between the magnetic free layer and the two-dimensional conductor or may be formed so that the magnetic free layer is in direct contact with the two-dimensional conductor. The two dimensional conductor can be formed on an electrically conductive substrate having an electrical conductivity that is lower than that of the two dimensional conductor.

When a current flows through the two-dimensional conductor, a spin polarization of electrons is generated in the two dimensional conductor. This spin polarization can be used to induce a voltage across the junction between the magnetic free layer and the two-dimensional conductor. This voltage varies with magnetization orientation of the free layer relative to the spin polarization in the two dimensional conductor. By eliminating the need for a pinned layer and associated AFM layer, the gap thickness of the sensor can be greatly reduced.

These and other features and advantages of the invention will be apparent upon reading of the following detailed description of preferred embodiments taken in conjunction with the figures in which like reference numerals indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION OF THE PREFERRED EMBODIMENTS

The following description is of the best embodiments presently contemplated for carrying out this invention. This description is made for the purpose of illustrating the general principles of this invention and is not meant to limit the inventive concepts claimed herein.

Figure 1:
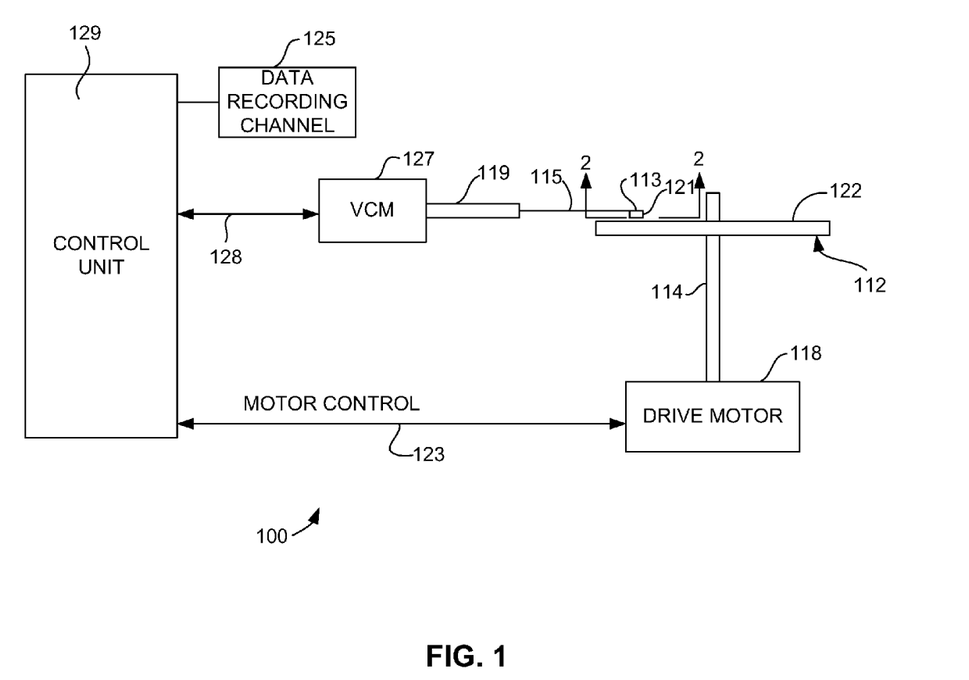
FIG. 1 is a schematic illustration of a disk drive system in which the invention might be embodied.

Referring now to FIG. 1, there is shown a disk drive 100 embodying this invention. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 can access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
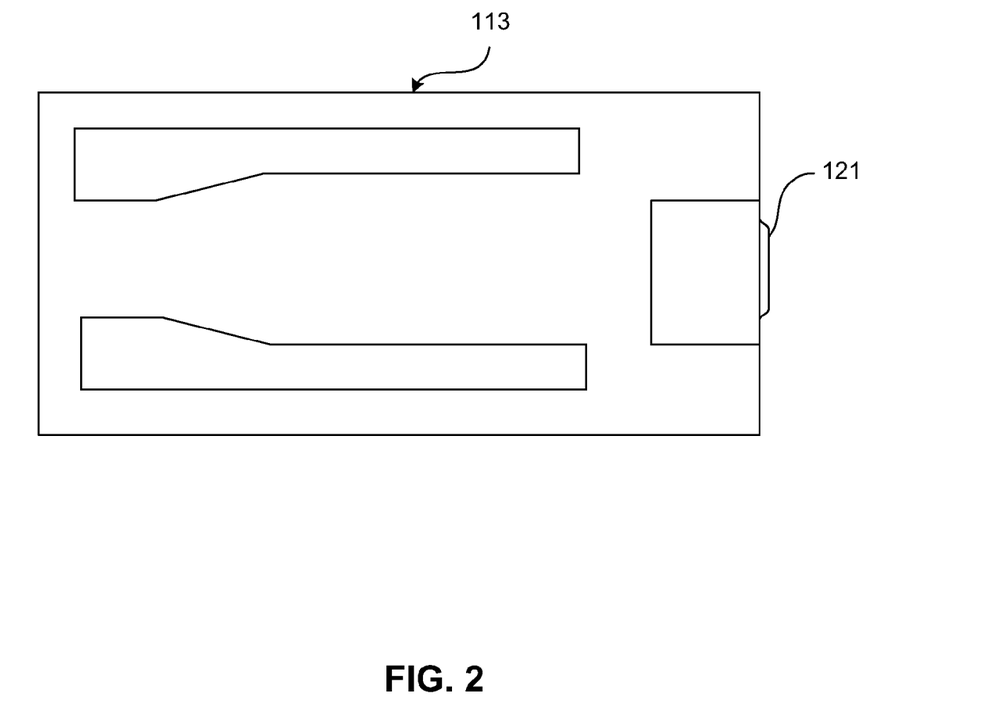
FIG. 2 is an ABS view of a slider illustrating the location of a magnetic head thereon.

With reference to FIG. 2, the orientation of the magnetic head 121 in a slider 113 can be seen in more detail. FIG. 2 is an ABS view of the slider 113, and as can be seen the magnetic head including an inductive write head and a read sensor, is located at a trailing edge of the slider. The above description of a typical magnetic disk storage system and the accompanying illustration of FIG. 1 are for representation purposes only. It should be apparent that disk storage systems may contain a large number of disks and actuators, and each actuator may support a number of sliders.

As discussed above, in order to increase data density it is necessary to decrease the read gap. The read gap is the spacing between magnetic shields of the read sensor and determines the down-track resolution. Magnetoresistive sensors such as GMR and TMR sensors require a pinned layer structure, a free layer structure and a non-magnetic spacer or barrier layer sandwiched between the pinned and free layer structures.

Figure 8:
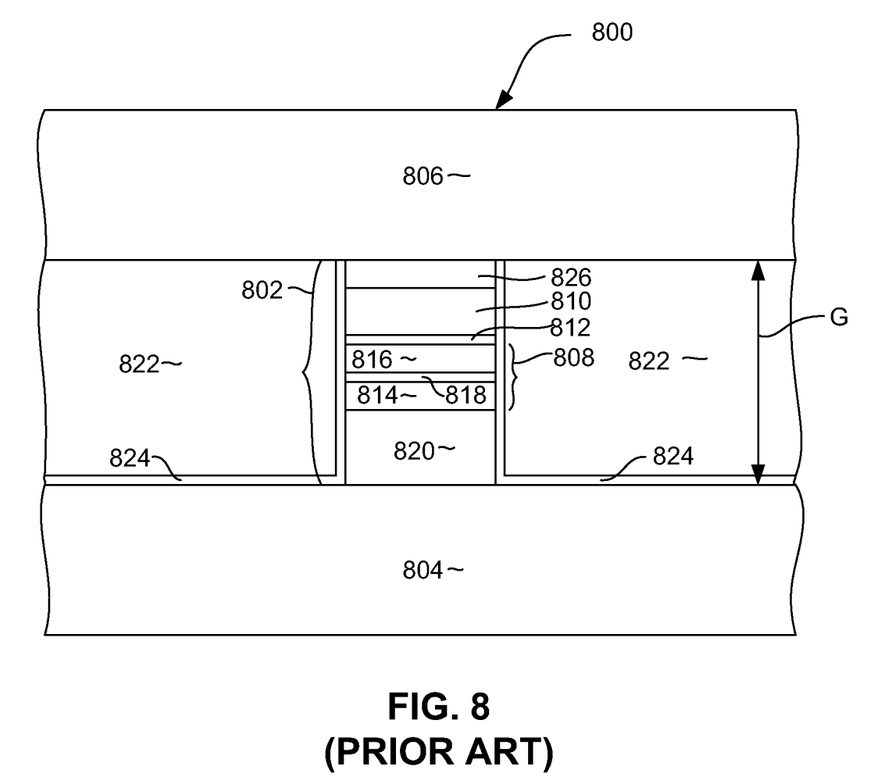
FIG. 8 is a schematic air bearing surface view of a prior art magnetic read sensor.

An example of such a prior art GMR or TMR sensor is illustrated with reference to FIG. 8. FIG. 8 shows a read element 800 that includes a sensor stack 802 sandwiched between first and second magnetic shields 804, 806, that also function as leads. The distance between the shields 804, 806 defines the gap thickness G. The sensor stack includes a pinned layer structure 808, a free layer structure 810 and a non-magnetic spacer or barrier layer 812 sandwiched between the free layer structure 810 and pinned layer structure 808. If the read element 800 is a GMR sensor, then the layer 812 will be a non-magnetic electrically conductive layer such as Cu. If the read element 800 is a TMR sensor, then the layer 812 will be a thin, non-magnetic, electrically insulating barrier layer, such as MgO.

The free layer 810 has a magnetization that is biased in a direction parallel with the air bearing surface. Magnetic biasing is provided by hard magnetic bias layers 822 located at either side of the sensor stack. The hard bias layers 822 are separated from the sensor stack 802 and from at least one of the shields by a thin, electrically insulating layer 824 that can be constructed of a material such as alumina. A capping layer 826 can be provided at the top of the sensor stack 802 to protect the under-lying layers during manufacture and to magnetically de-couple the free layer 810 from the upper shield 806.

The pinned layer structure 808 includes first and second magnetic layers 814, 816 that are anti-parallel coupled across a non-magnetic, anti-parallel coupling layer such as Ru 818. The first magnetic layer 814 is exchange coupled with a layer of AFM material such as IrMn or PtMn 820. In order for the magnetic/AFM coupling to exhibit the necessary pinning strength, the AFM layer 820 must be relatively thick. As can be appreciated, the pinned layer structure 808 and AFM 820 consume a large amount of read gap. In addition, in a current-perpendicular-to-the-plane (CPP) GMR sensor a large fraction of the signal is generated and sensed in the bulk of the magnetic layers. As a consequence, the thickness of the magnetic layers (both in the pinned layer structure and free layer) needs to be long enough compared to the spin diffusion length of the magnetic layers to obtain a sizable signal. This poses limitations on the minimum thickness of these layers.

In addition, the lithographic control of the reader width is more difficult to achieve with thicker structures. Thus, thinner readers are also beneficial for achieving narrower track-widths which minimizes side reading and enables higher cross-track resolution in magnetic recording.

Figure 3:
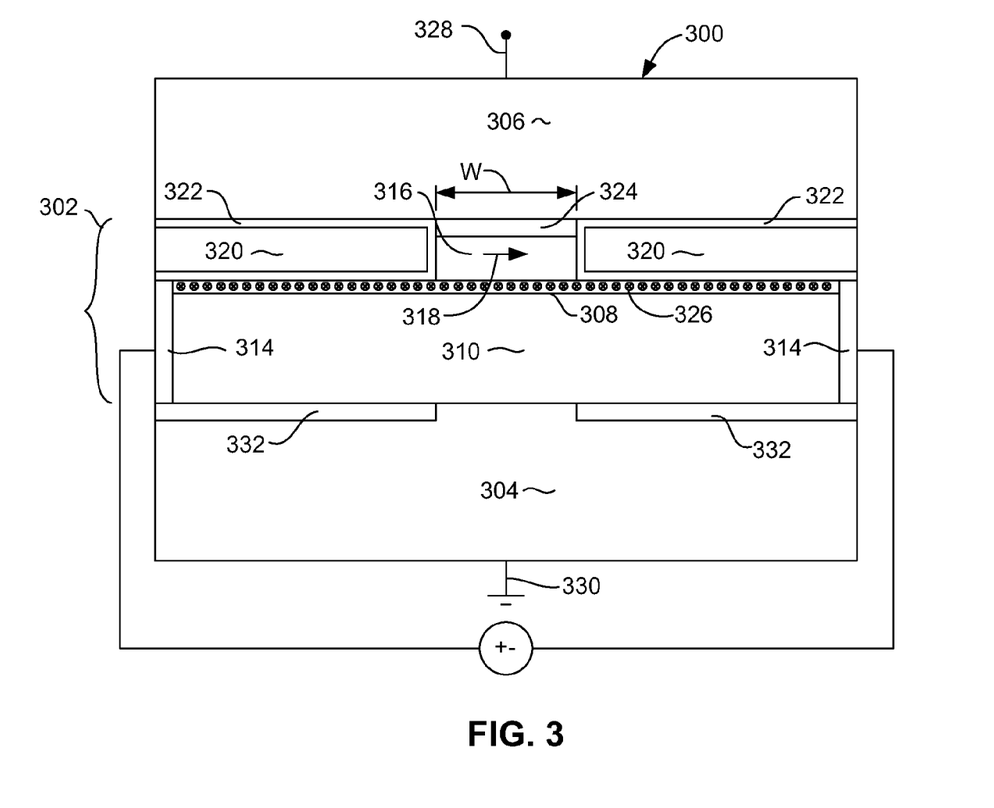
FIG. 3 is a schematic air bearing surface view of a magnetic read sensor according to an embodiment of the invention.

FIG. 3 is a schematic illustration of a magnetic read sensor 300 according to an embodiment of the invention as viewed from the air bearing surface that utilizes Rashba effect to generate spin polarization. The sensor 300 includes a sensor stack 302 sandwiched between first and second (or upper and lower) electrically conductive, magnetic shields 304, 306. The electrically conductive, magnetic shields 304, 306 can be constructed of a material such as Ni-Fe.

The sensor stack 302 includes a two-dimensional conductor layer 308 formed on conductive substrate 310. First and second electrically conductive leads 314 can be connected with opposite ends of the two-dimensional conductor layer 308 and conductive substrate 310. The leads 314 are connected with an electrical current source for generating an electrical current through the substrate 310 and two-dimensional conductor 308. An insulation layer 332 can be disposed between the substrate layer 310 and the adjacent shield 304 in order to prevent current shunting through the shield 304. The insulation layer 332 can, however, be formed with an opening to allow the detection of voltage signal between the shields 304, 306 as will be seen below.

The substrate 310 has an electrical conductivity that is significantly lower than that of the two-dimensional conductor 308 to prevent shunting of electrons through the substrate and to ensure that a predominant amount of the electrons travel through the two dimensional conductor 308. Also, to function as a two dimensional conductor, the layer 308 can be constructed very thin, preferably having a thickness no greater than 2 nm, and more preferably less than that. The two dimensional conductor can be constructed of aluminum (Al), copper (Cu), silver (Ag), gold (Au), bismuth (Bi), or lead (Pb) and the substrate 310 can be constructed of tungsten (W), platinum (Pt), silicon (Si) or germanium (Ge). However, any combination of conductive materials that preserves two-dimensional transport through layer 308 and provides strong-enough Rashba spin-orbit interaction of charge carriers in that layer should satisfy. Here, strong-enough means that the energy of spin splitting due to Rashba spin-orbit interaction should be significantly higher than thermal energy at room temperature. The electrical conductivity and thickness of the substrate 310 should be sufficiently low to prevent significant parallel conduction that may shunt current through the two dimensional conductor layer 308.

A magnetic free layer 316 is formed over and in direct contact with the two-dimensional conductor 308. The magnetic free layer 316 has a magnetization that is biased in a direction that is substantially parallel with the ABS as indicated by arrow 318, but which is able to move in response to an external magnetic field, such as from a magnetic media. Magnetic biasing of the magnetization 318 of the magnetic free layer 316 can be provided by first and second hard magnetic bias layers 320, which provide a magnetic bias field in a direction parallel with the ABS. The hard bias layers 320 can be separated from the magnetic free layer 316, adjacent shield 306 and two dimensional conductor 308 by thin electrically insulating layers 322 to prevent the shunting of electrical sensor current through the hard bias layers 320.

The electrically conductive substrate 310, two dimensional conductor 308 and magnetic free layer 316 form a quantum well structure that preserves two-dimensional conductivity and Rashba spin orbit interaction in the layer 308.

The magnetic free layer 316 has a width W that determines the reader-width of the magnetic sensor 300 for purposes of magnetic data recording. A non-magnetic capping layer 324 can be formed at the top of the magnetic free layer 324 to protect the magnetic bias layer 316 during manufacturing and to magnetically de-couple the magnetic free layer 316 from the adjacent magnetic shield 306.

The sensor described above can achieve shield to shield spacing significantly narrower than that possible with present magnetoresistive sensor technologies. For example, having a 5 nm thick substrate 310 and a two dimensional conductor 308, a 3 nm thick magnetic free layer 316 and a 2 nm thick capping layer 324, the total read gap thickness can be 10 nm.

The two-dimensional conductor 308 has a large Rashba energy for generating reference spin polarization density in response to an electrical current density j. The spin polarization is indicated by arrow tail symbols 326. The spin polarization lies in the plane of the two-dimensional conductor 308 and is directed perpendicular to the current direction and thus perpendicular to the ABS plane (i.e. in the transverse direction, similar to the spin polarization generated by a magnetic pinned layer structure in GMR or TMR magnetic sensor). The spin polarization, however, can be oriented in one of two directions, depending on the type of charge carriers (electrons or holes) and sign of the Rashba spin orbit interaction (positive or negative).

The polarization of charge carriers 326 in the two dimensional conductor 308 and the magnetization 318 result in a voltage output that can be measured between the magnetic shields 304, 306 (e.g. between lead 328 and ground 330), which varies with relative orientation of the magnetization 318 with respect to the direction of spin polarization 326. In a quiescent state (e.g. magnetization 318 parallel with the ABS) the output voltage is zero. However, movement of the magnetization 318 of the free layer 316 in response to a magnetic field, toward or away from aligning with the transverse spin orientation 308 induces an electrical voltage across the shields 304, 306 that will be proportional to sin θ, where θ is the in plane angle between the magnetization direction 318 of the magnetic free layer 316 and the quiescent, longitudinal direction shown in FIG. 3.

Figure 4:
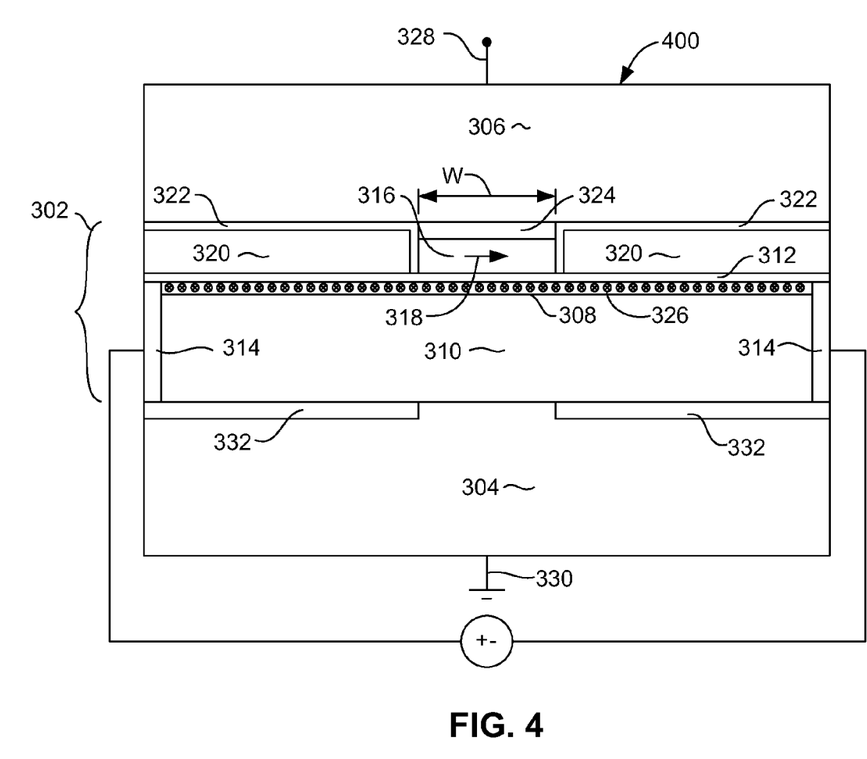
FIG. 4 is a schematic air bearing surface view of a magnetic read sensor according to an alternate embodiment of the invention.

FIG. 4 shows a schematic, ABS view of a magnetic sensor 400 according to an alternate embodiment of the invention. The sensor 400 is similar to the sensor 300 described above with reference to FIG. 3, except that the sensor 400 includes a thin, non-magnetic, electrically insulating barrier layer 312 located between the free layer 316 and the two dimensional conductor 308. The thin, electrically insulating barrier layer 312 is formed on the two-dimensional conductor layer 308 in order to ensure that the layer 308 functions as a two-dimensional conductor and to preserve the Rashba spin-orbit interaction of the two-dimensional conduction states. The layer can also help in providing higher voltage across the junction between the free layer 316 and the two dimensional conductor 308.

Figure 5:
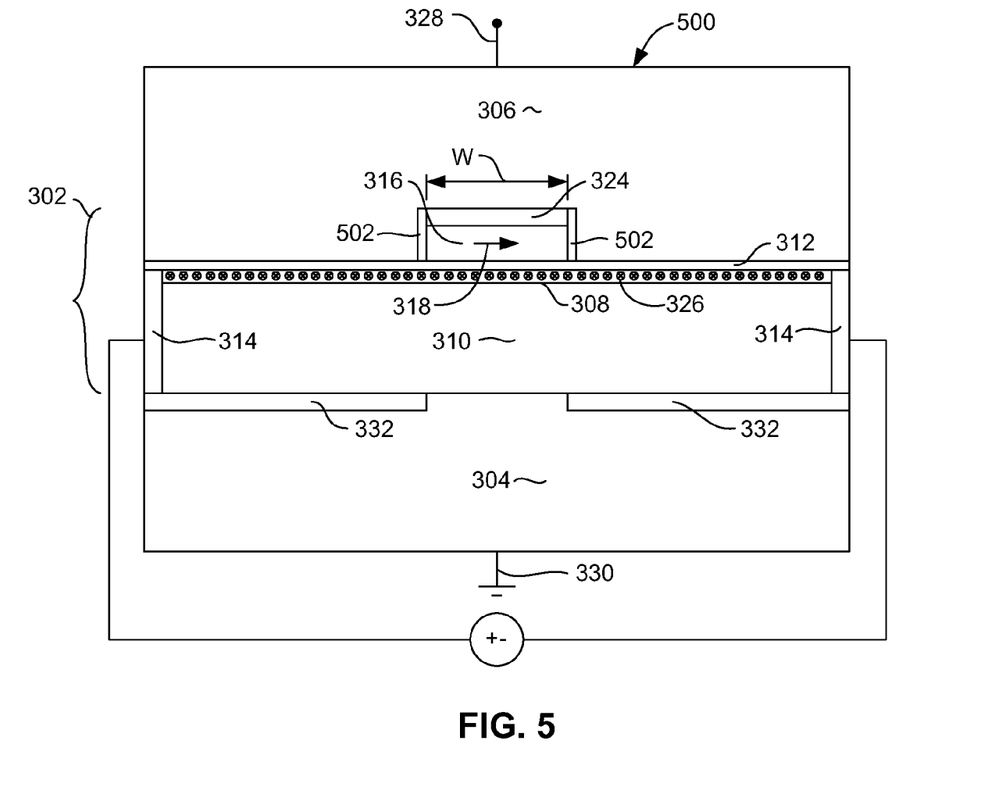
FIG. 5 is a schematic air bearing surface view of a magnetic read sensor according to an alternate embodiment of the invention.

FIG. 5 shows a schematic, ABS view of a magnetic sensor 500 according to another embodiment of the invention. The sensor 500 is similar to the sensor 400 of FIG. 3, except that it incorporates top side shield and does not require the bias layers 320 of FIG. 4. In this embodiment, magnetic biasing of the magnetization 318 is provided by a side shield 306. The sensor 500 can include insulation layers 502 at either side of the magnetic free layer 316 and capping layer 324. Although the sensor 500 is shown including the barrier layer 312, the sensor can be constructed without the barrier layer 312 and with the free layer 316 being in direct contact with the two-dimensional conductor 308 (as with the sensor 300 of FIG. 3).

Figure 6:
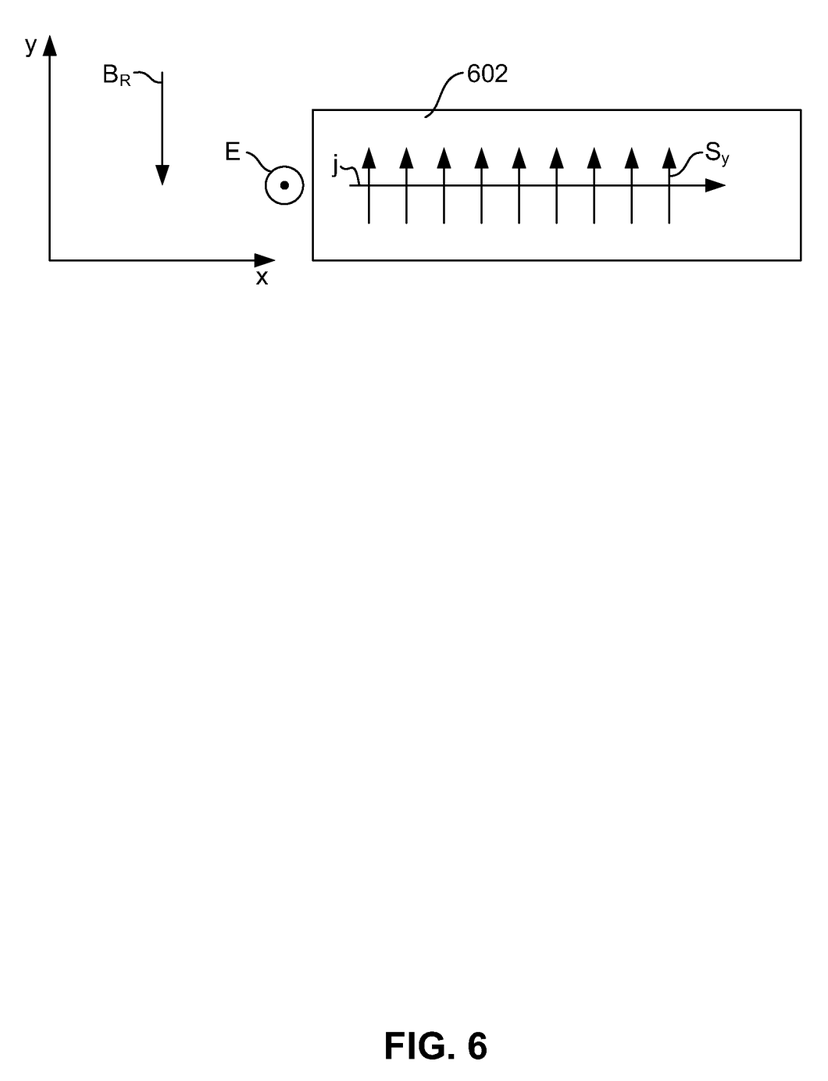
FIG. 6 is a schematic illustration of the spin polarization generated by the Rashba effect in a two dimensional conductor.
Figure 7:
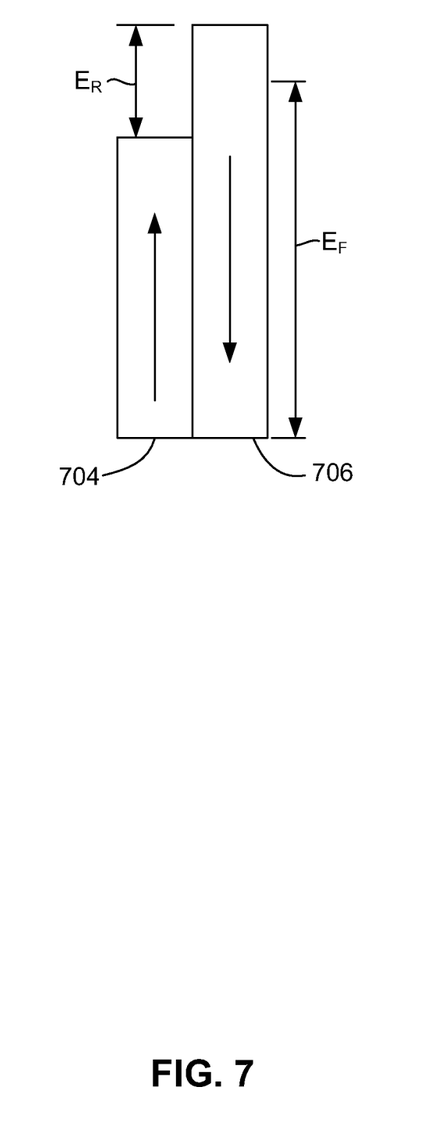
FIG. 7 is a graphical illustration of a magnitude of energy splitting of spin sub-band density of states in a two dimensional conductor induced by a Rashba effect.

The physics of the Rashba effect and resulting spin polarization in the two dimensional conductor as utilized in the above described sensors 300, 400, 500 (FIGS. 3, 4 and 5). Rashba effect refers to the lifting of spin degeneracy of the electronic states via spin-orbit interaction in two-dimensional electron (or hole) systems such as quantum wells, surfaces or interfaces. With reference to FIG. 6, the spin orbit interaction arises from the intrinsic breaking of the inversion symmetry which results in electric field E perpendicular to a two dimensional electron plane 602, shown in the x-y direction in FIG. 5, and thus transforms into an effective momentum-dependent in-plane magnetic field $B_R$, called a Rashba field, which Zeeman splits the electron density of states near the Fermi level. FIG. 7 graphically shows the Fermi level energy $E_F$ and related Rashba energy $E_R$ between two spin sub-band densities of states. The magnitude of the effect is quantified by the Rashba energy $E_R$ which refers to the difference between the potential energy of spin-up and spin-down electrons 704, 706 induced by the Rashba effect. When electrical current density j (FIG. 6) is applied in the x-direction through a 2 dimensional conductor 602 with Rashba spin-split density of states, the y spin polarization density is generated in the conductor plane. The effect can exist in both metals and semiconductors or their layered structures. The magnitude of the spin polarization density is given as:

$$S_y = \frac{E_R}{2v_F E_F} \frac{j}{e} \quad \text{(equation 1)}$$

where $v_F$ and $E_F$ are the electron Fermi velocity and Fermi energy, respectively, and e is the electron charge.

The spin polarization density generated in a two-dimensional conductor via Rashba effect can be transformed into an electrical voltage using a ferromagnetic layer adjacent to the two dimensional conductor. The spin polarization density induces spin dependent chemical potential:

$$\mu_s = S_y/N(E_F) \quad \text{(equation 2)}$$

where $N(E_F)$ is the electron density of states at the Fermi level. When the conductor surface is contacted by a ferromagnetic layer FM an electrical potential $$\phi_s = (\vec{P}\cdot\hat{y})\mu_s/e \quad \text{(equation 3)}$$

is generated across the FM/NM interface. In the above equation $\vec{P}=P\cdot\hat{m}$ is the interfacial spin polarization vector, $\hat{m}$ is the unit vector in the FM magnetization direction; $\hat{y}$ is the unit vector in the direction of the reference surface spin polarization density. The potential difference between parallel and anti-parallel orientations of $\vec{P}$ and $\hat{y}$ is:

$$\Delta V = 2P\frac{\mu_s}{e} \quad \text{(equation 4)}$$

Using equations 1, 2 and 4, and the relations $N(E_F)E_F=n/2$ and $j=nev_d$ for a two-dimensional conductor (n and $v_d$ are the electron density and drift velocity, respectively) one obtains:

$$\Delta V = 2P\frac{E_R}{e}\frac{v_d}{v_F} \quad \text{(equation 5)}$$

In principle, the ratio of $V_d/V_f$ can be of the order of 0.1 to 1 in high mobility two-dimensional conductors, while $E_R$ of up to 300meV and P values of up to 0.4 at room temperature have been reported. In the sensors 400, 500 of FIGS. 4 and 5, the presence of the barrier layer 312 may help to maximize the parameter P in equation 5 above. Thus, the generation of output voltage signals of about 10-100 mV should be possible with sensors as described above with reference to FIGS. 3, 4 and 5.

While various embodiments have been described above, it should be understood that they have been presented by way of example only and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A magnetic sensor, comprising:
 a two-dimensional conductor formed on an electrically conductive substrate;
 a magnetic free layer formed adjacent to the two-dimensional conductor;
 wherein the two-dimensional conductor is formed as a layer that has an electrical conductivity that is greater than that of the electrically conductive substrate and has a thickness no greater than 2 nm;
 circuitry configured to apply a voltage across the two-dimensional conductor, electrically conductive substrate and magnetic free layer in a direction perpendicular to these layers; and
 circuitry connected with the two-dimensional conductor to supply an electrical current through the two-dimensional conductor in a direction in the plane of the two-dimensional conductor so as to cause electron spin alignment in the two-dimensional conductor as a result of the Rashba effect.

2. The magnetic sensor as in claim 1, wherein the magnetic free layer is in direct contact with the two-dimensional conductor.

3. The magnetic sensor as in claim 1, further comprising a non-magnetic electrically insulating barrier layer sandwiched between the magnetic free layer and the two-dimensional conductor.

4. The magnetic sensor as in claim 1, wherein the two-dimensional conductor has a thickness less than 1 nm.

5. The magnetic sensor as in claim 4, further comprising first and second magnetic bias layers formed adjacent to first and second sides of the magnetic free layer and separated from the first and second sides of the free layer by first and second non-magnetic insulation layers.

6. The magnetic sensor as in claim 1, wherein the spin polarization of electrons is in a direction perpendicular to the air bearing surface.

7. The magnetic sensor as in claim 1, wherein the electrically conductive substrate, two-dimensional conductor and magnetic free layer are located between first and second electrically conductive magnetic shields.

8. A magnetic sensor, comprising:
 a quantum well structure including an electrically conductive substrate and a two-dimensional conductor, the two-dimensional conductor being formed as a layer that has an electrical conductivity that is greater than that of the electrically conductive substrate and has a thickness no greater than 2 nm;
 a magnetic free layer formed adjacent to the quantum well structure;
 circuitry configured to apply a voltage across the two-dimensional conductor, electrically conductive substrate and magnetic free layer in a direction perpendicular to these layers; and
 circuitry connected with the two-dimensional conductor to supply an electrical current through the two-dimensional conductor in a direction in the plane of the two-dimensional conductor so as to cause electron spin alignment in the two-dimensional conductor as a result of the Rashba effect.

9. The magnetic sensor as in claim 8 wherein the magnetic free layer is in direct contact with the two-dimensional conductor.

10. The magnetic sensor as in claim 8, further comprising a non-magnetic, electrically insulating barrier layer located between the magnetic free layer and the two-dimensional conductor.

11. The magnetic sensor as in claim 8, wherein the sensor has an air bearing surface, and wherein the electrical current flows in a direction parallel with the air bearing surface.

12. The magnetic sensor as in claim 11, wherein the magnetic free layer has a magnetization that is biased in a direction parallel with the air bearing surface and that is free to move in response to a magnetic field.

13. The magnetic sensor as in claim 11, wherein the quantum well structure is configured such that a spin polarization of electrons is oriented in a direction that is perpendicular to the air bearing surface.

14. The magnetic sensor as in claim 8, wherein the electrically conductive substrate comprises Ge or Si and the two-dimensional conductor comprises Pb.

15. The magnetic sensor as in claim 8, wherein the two-dimensional conductor comprises Al, Cu, Ag, Au or Bi and has a thickness of <2 nm and the electrically conductive substrate comprises W or Pt and has a thickness of <5 nm.

* * * * *